United States Patent [19]

Doriath et al.

[11] 4,449,096

[45] May 15, 1984

[54] MEASURING HEAD FOR MAGNETOMETER AND MAGNETOMETER INCORPORATING SUCH A HEAD

[75] Inventors: Gérard Doriath; Roger Gaudry; Georges Hepner, all of Paris, France

[73] Assignee: Thomson-CSF, Paris, France

[21] Appl. No.: 212,620

[22] Filed: Dec. 3, 1980

[30] Foreign Application Priority Data

Dec. 14, 1979 [FR] France .................. 79 30721

[51] Int. Cl.³ .................. G01R 33/032; G02F 1/09
[52] U.S. Cl. ........................ 324/244; 350/377
[58] Field of Search ............ 324/244, 249, 260, 96; 350/375–379

[56] References Cited

U.S. PATENT DOCUMENTS

| | | | |
|---|---|---|---|
| 3,512,867 | 5/1970 | Pearson et al. | 350/378 X |
| 3,756,690 | 9/1973 | Borrelli et al. | 350/151 |
| 3,990,777 | 11/1976 | Auracher | 350/378 X |
| 4,112,367 | 9/1978 | Hepner et al. | 324/244 |

FOREIGN PATENT DOCUMENTS 2355299  1/1978  France .

OTHER PUBLICATIONS

Shirasaki et al., "Bistable Magnetooptic Switch Using YIG Crystal . . . ", Conference on Lasers and Electro-Optics, Wash. D.C., Jun. 10–12, 1981, pp. 144, 145.
"Excitation of Hybrid Modes in Magnetooptic Waveguides", Applied Optics, vol. 13, No. 5, pp. 1001–1004, May 1974, by J. Warner; p. 1001, col. 2, line 13 and p. 1002, col. 1, line 15; P. 1003, col. 2, lines 21–35.

*Primary Examiner*—Gerard R. Strecker
*Attorney, Agent, or Firm*—Oblon, Fisher, Spivak, McClelland & Maier

[57] ABSTRACT

The invention relates to magnetometers making it possible to measure a magnetic field by the Faraday effect in a thin YIG layer which involves taking a YIG layer which is sufficiently thick to permit a multimode transmission of the polarized light beam, as well as the entrance and exit of said beam from the edge of the layer. This device makes it possible to produce a magnetometer head, whose elements are integrated on a substrate and whose volume is approximately 1 cm³.

6 Claims, 2 Drawing Figures

MEASURING HEAD FOR MAGNETOMETER AND MAGNETOMETER INCORPORATING SUCH A HEAD

BACKGROUND OF THE INVENTION

The present invention relates to measuring heads for magnetometers making it possible to measure a magnetic field in which the head is present. It also relates to magnetometers incorporating such a head and which are constituted by a measuring case having a relatively large size connected by a cable to a small head able to measure the magnetic field in narrow spaces, making it possible to arrange magnetic gradient cards.

U.S. Pat. No. 4,112,367 published Sept. 5, 1978 describes a magnetometer utilizing the Faraday effect in thin layers of certain materials such as yttrium iron garnet, called YIG. A light beam produced by a laser is propagated in said magnetometer in a thin layer with a thickness of a few microns. This light beam is propagated in guided manner in accordance with a single mode, e.g. TM. For selecting this mode and bearing in mind the limited thickness of the layer, said light beam must be introduced into the layer by means of a coupling prism. Under the action of the magnetic field in which is present in the thin layer, the propagation mode is converted into a TE mode with a percentage varying as a function of the magnetic field value. To extract the light beam from the layer a birefringent material prism is used, which supplies two angularly separated light beams, one corresponding to the TE mode and the other to the TM mode. The intensity of the beam corresponding to the TE mode is a function of the intensity of the magnetic field in which is plunged the thin layer. As this function is not linear a zero method is used for carrying out the measurement and this consists of compensating the magnetic field to be measured within the thin layer by a regulatable opposing field produced by a coil. To detect this compensation an alternating field is superimposed on this direct field leading to the appearance in the beam corresponding to the TE mode of a modulation which only contains, when compensation has taken place, even harmonics of the frequency of the alternating field due to the fact that the Faraday effect is dependent on the value of the magnetic field and not on its direction. When the compensation is not produced uneven components are detected in the modulated beam and specifically of the fundamental type. These components are used for controlling a servomechanism, which regulates the compensating field to obtain the disappearance of these uneven components.

Although the measuring layer is of small size, the auxiliary means required for the use thereof are much larger and are difficult to adjust. Thus, the input and output prisms necessary for obtaining a coupling of the beam with the layer and for angularly separating the two beams at the output are relatively large and the pressure with which they must be engaged on the layer must be adjusted in a critical manner by means of devices such as screws, which further increase the overall dimensions. Correlatively the assembly must be surrounded by large coils. In addition, monomode propagation requires the use of a high power and consequently large laser as the light source. Finally the angular separation of the beams from the output prism is not very great and involves positioning the detector far enough away to ensure that it is only excited by the single beam selected.

Under these conditions the measuring head incorporating all these members is much larger than would have been expected in view of the small size of the sensitive layer.

BRIEF SUMMARY OF THE INVENTION

In order to obtain a small measuring head the invention proposes a measuring head for a magnetometer of the type incorporating means for generating a linearly polarized beam of light, a planar layer of a magnetic material making it possible to propagate this beam in its plane and rotate its polarization direction and means making it possible to measure this rotation, wherein the thickness of the magnetic material layer permits a multimode guided propagation of the beam and, in conjunction with the beam generation means and the rotation measuring means, the entrance and exit of the beam through the edge of the layer.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
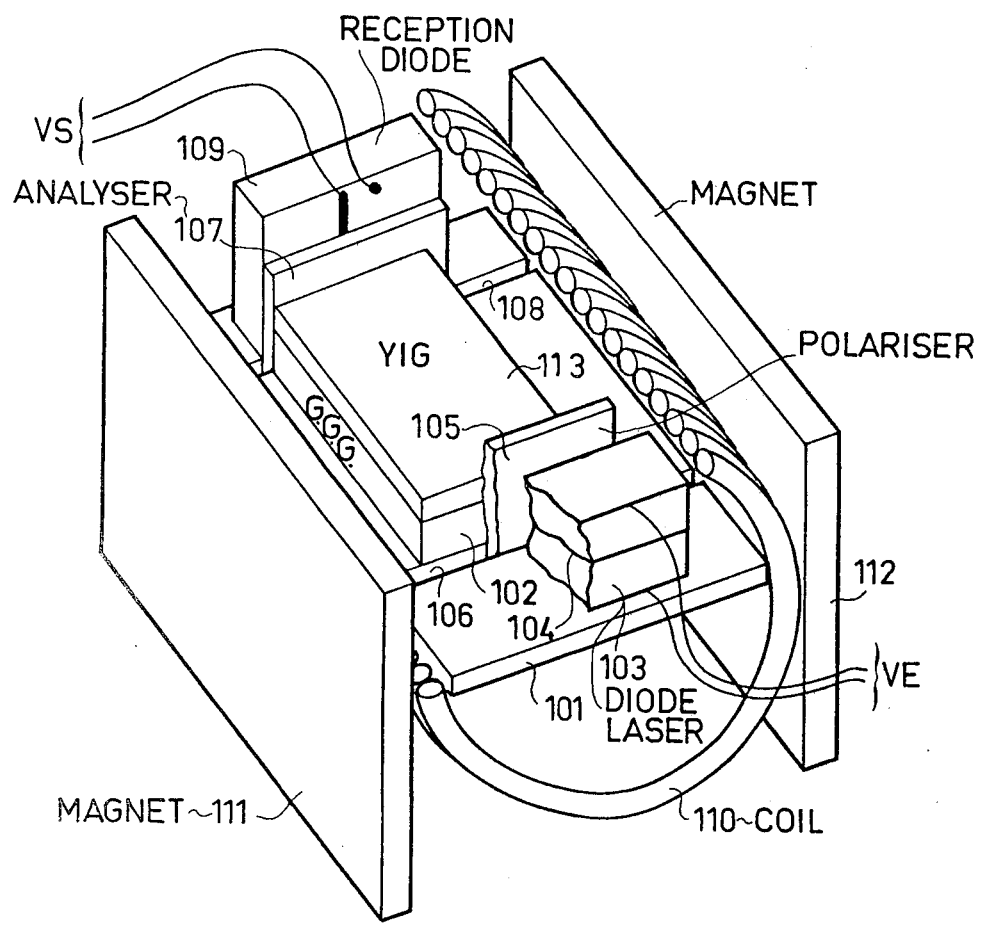
FIG. 1 a view of a model of a measuring head according to the invention.

The magnetometer head shown in FIG. 1 comprises a ceramic plate 101 used as a support for the active components of the head. On to the center of plate 101 is stuck a smaller plate 102 shaped by cutting into a gadolinium gallium garnet called GGG, of length 10 mm, width 3 mm, and thickness 0.7 mm. A relatively thick substituted YIG layer 113 is grown by epitaxy on the GGG surface and is essentially of composition $Y_{2.45}Gd_{0.55}$, $Fe_{4.1}O_{12}$. The thickness obtained can be between 30 and 110 microns, a typical value being 50 microns.

Such a YIG thickness makes it possible to propagate light in a guided but multimode manner and under these conditions the Faraday effect due to the magnetic field is only manifested by a rotation of the light polarization plane. This makes it possible to couple the light beam by the terminal faces of the YIG layer 113.

However, to obtain this coupling it is necessary for the entrance and exit surfaces to be as perfect as possible. Generally it is not possible to find a cleavage axis due to the inhomogeneity of the material, making it necessary to polish the faces. In view of the thinness of the sample it is embedded in a support by fixing it thereto, e.g. by a layer of wax. Thus, the complete support and the exit face can be polished without causing fractures. However, level with the interface between the upper surface of the YIG and the wax which holds it in the support there is a disturbed area whose thickness does not exceed 10 microns and which has been found not to influence the coupling with the light source and the detector in the case of the thicknesses referred to hereinbefore.

The polishing procedure involves e.g. grinding with emery of successive grain sizes 22.5, 12.5 and 9.5 microns, polishing on a fabric impregnated with a mixture of ferrous oxalate and alumina, and a final physico-chemical polishing.

The light source is formed by a laser diode 103 fixed to plate 101 in such a way that its junction by edge 104 from which passes the coherent light beam is positioned substantially in the centre of the YIG layer. As the emissive surface of such a diode substantially has a thickness of 0.2 micron and a width of 15 microns, said positioning is relatively simple by acting e.g. on the layer of glue fixing the laser diode to plate 101 or, if necessary, by placing a shim between the diode and the plate. This diode is energized with a suitable voltage VE via two input connections.

A polarizer 105 is positioned between the laser diode and the substrate carrying the YIG layer. This polarizer permits the linear polarization of the light emitted by the laser diode in the YIG layer. This polarizer is, for example, cut in a polarizing film of a type widely used in optics. Its thickness is such that it does not disturb the coupling between the emitting diode and the YIG layer, provided that the polarizer is moderately gripped between the diode and plate 102. A groove 106 made in plate 101 facilitates the mounting of the polarizer by fixing the latter, e.g. with a drop of glue before positioning plate 102 and diode 103.

At the other end of plate 102 is positioned an analyzer 107, which is similar to the polarizer 105, but which is crossed with respect thereto and for fitting purposes is fixed in another groove 108.

The analyzer is lightly gripped between plate 102 and a detecting photodiode 109. The latter is, for example, of the germanium type and is exposed to a reverse polarization of about 10 volts and is active surface is essentially in the form of a rectangle to trap the maximum light leaving the YIG layer. Under these conditions it emits a signal VS.

Plate 101 and all the active elements which it carries are placed within a coil 110 making it possible to apply the compensating magnetic field and the alternating measuring field.

In order for the Faraday rotational effect to occur in the YIG layer the initial magnetization of said layer must be crosswise with respect to the direction of the light therein. For this purpose it is necessary to use means which induce this transverse field with a value of approximately 1 Oersted. These means are, for example, permanent magnets shown in the form of blocks 111, 112 in the drawing. It is also possible to use Helmholtz coils in place of magnets 111, 112 if it is desired to optimize the value of this field as a function of the sensitivity to be obtained.

The drawing clearly shows that the overall dimensions of the measuring head obtained are approximately the same as the largest dimension of plate 101, i.e. approximately 1 cm.

Figure 2:
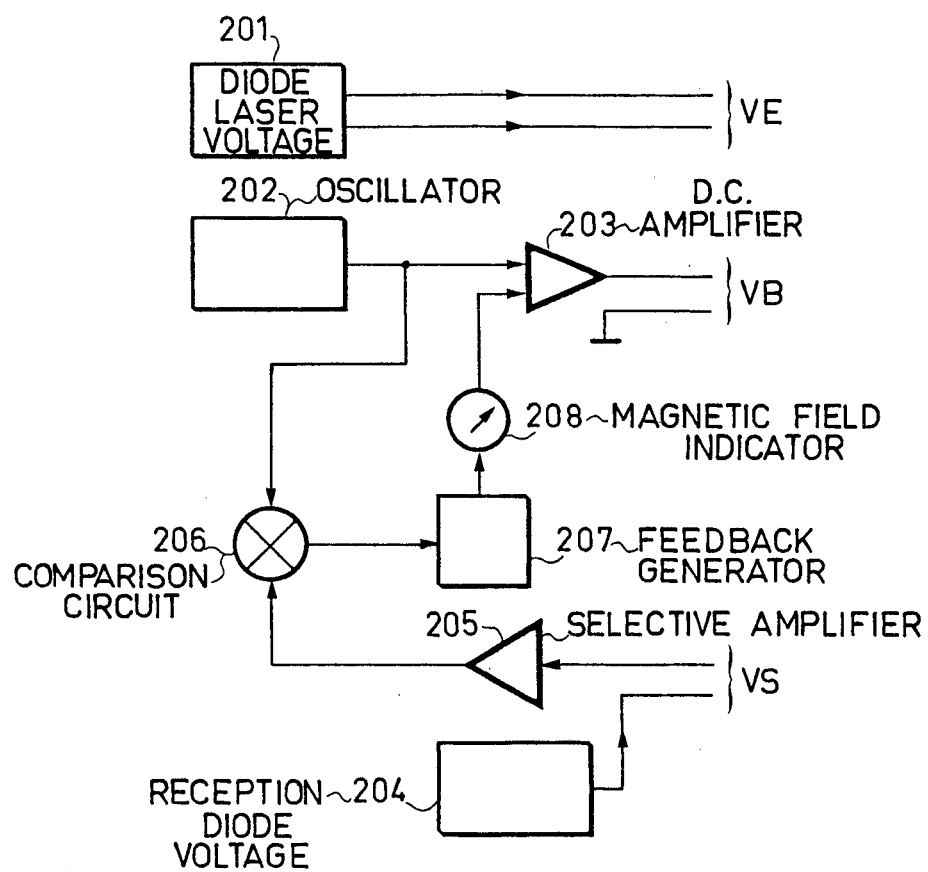
FIG. 2 a diagram of the electronic members connected to the measuring head.

The measuring head of FIG. 1 is connected by a multi-core cable to the electronic members including the supply and processing devices, whose simplified diagram is shown in FIG. 2.

The latter firstly comprises a stabilized power supply 201 supplying the current necessary for energizing the laser diode 103. A light power of four milliwatts is obtained with an intensity of 200 milliamperes for a laser diode emitting in infrared at a wavelength of 1.3 micron. Such a light power at this wavelength easily makes it possible for the device to operate with the desired sensitivity.

An oscillator 202 supplies a signal at a relatively high frequency, e.g. 100 kHz. This signal is added to a continuous or slightly variable signal in an amplifier 203, which supplies a voltage VB applied to solenoid 110.

A voltage generator 204 makes it possible to supply the polarization voltage of diode 109 which, by detecting the light beam, supplies the signal VS. Signal VS is amplified in a selective amplifier 205 centred on the frequency of the signal supplied by oscillator 202.

The signal at the output of amplifier 205 is compared with the signal at the output of oscillator 202 in a synchronous detector 206 which measures both the amplitude of the signal at the fundamental frequency and its phase change during the zero passage of said amplitude. This detector supplies an error signal.

This error signal is applied to a servomechanism 207 comprising, for example, a voltage generator and a correcting filter making it possible to generate a negative feedback voltage, which, applied via amplifier 203 to coil 110, cancels out the error signal at the output of comparator 206 by compensating the magnetic field to be measured within the YIG layer 113.

To obtain the value of the magnetic field to be measured, the value of the compensating magnetic field is measured via the value of the signal which generates it and which is applied by the FEEDBACK GENERATOR 207 to amplifier 203.

To this end a measuring apparatus 208 is inserted between FEEDBACK GENERATOR 207 and amplifier 203.

Under these conditions and for the numerical values given hereinbefore the measuring head, whose volume is approximately 1 cm$^3$, has a sensitivity of approximately $10^{-7}$ Oersted for a magnetic field which can develop in a frequency range varying from the continuous range to 1000 Hertz.

What is claimed is:

1. A measuring head for a magnetometer comprising:
    polarized light beam emitting means including a diode and a polarizer for producing a polarized light beam;
    magnetic field producing means;
    a planar layer of a magnetic material deposited on a substrate having a first and second edge with said polarizer being located near said first edge and wherein the thickness of said magnetic layer permits a multimode guided propagation of said beam in the plane of said layer and also permits the rotation of said beam in its polarization direction wherein said magnetic field producing means produces in said layer a magnetic field perpendicular to the propagation direction of said beam of polarized light and wherein said magnetic field is parallel to the plane of said layer; and
    means for measuring said rotation, wherein said rotation measuring means comprises an analyzer and a photodetector placed on the second edge of said layer.

2. A head according to claim 1, wherein it also comprises a plate which is able to support said emitting diode, said polarizer, said analyzer and said photodetector, so as to bring about coincidence between the active area of said emitting diode and said photodetector with the edge of said magnetic material layer, said plate further including a first groove for facilitating the gripping of said polarizer between said emitting diode and said substrate and a second groove for facilitating the gripping of said analyzer between said photodetector and said substrate.

3. A head according to claim 1, wherein said emitting diode is a laser diode, and said polarizer and analyzer are polarizing films.

4. A head according to claim 1, wherein the rotation measuring means also comprise a coil making it possible to induce in the magnetic material layer a magnetic field which is parallel to the propagation direction in said planar layer said magnetic field having an alternating component and a component compensating the magnetic field to be measured.

5. A head according to claim 1, wherein said magnetic material is a yttrium, gallium garnet grown by epitaxy on a substrate of gadolinium gallium garnet with a thickness between 30 and 110 microns.

6. A head according to claim 1, wherein the wavelength of the polarized light is substantially 1.3 micron.

* * * * *